United States Patent [19]
Shirley et al.

[11] Patent Number: 6,128,237
[45] Date of Patent: Oct. 3, 2000

[54] METHOD AND APPARATUS FOR ENHANCING THE PERFORMANCE OF SEMICONDUCTOR MEMORY DEVICES

[75] Inventors: Brian Shirley; Timothy B. Cowles, both of Boise, Id.

[73] Assignee: Micron Technology, Inc., Boise, Id.

[21] Appl. No.: 09/455,365

[22] Filed: Dec. 6, 1999

Related U.S. Application Data

[63] Continuation of application No. 09/058,255, Apr. 10, 1998, Pat. No. 6,026,042.
[51] Int. Cl.⁷ ...................................................... G11C 7/02
[52] U.S. Cl. ........................... 365/207; 365/205; 365/210
[58] Field of Search ................................... 365/205, 207, 365/210, 230.06, 194

[56] References Cited

U.S. PATENT DOCUMENTS 4,926,382   5/1990   Sakui et al. ............................... 365/203

OTHER PUBLICATIONS

Daeje Chin et al., "An Experimental 16Mb DRAM with Reduced Peak–Current Noise," Samsung Electronics Co., Ltd., Semiconductor Business R&D Center, Kyungki–do, Korea.

*Primary Examiner*—Vu A. Le
*Attorney, Agent, or Firm*—Dickstein Shapiro Morin & oshinsky LLP

[57] ABSTRACT

A method and apparatus for reducing a peak current produced by the simultaneous activation of numerous sense amplifiers associated with an active word line, without reducing the speed of operation of the semiconductor memory device. A memory array includes word lines accessing memory cells and a tracking word line for sequentially activating the sense amplifiers connected to the digit lines by introducing a delay after the activation of each sense amplifier or group of sense amplifiers and before activating the next sense amplifier or group of sense amplifiers, so that the total time for activation of the sense amplifiers for all digit lines associated with an active word line is spread out, but is not longer than the time necessary for activation of an entire word line.

22 Claims, 5 Drawing Sheets

METHOD AND APPARATUS FOR ENHANCING THE PERFORMANCE OF SEMICONDUCTOR MEMORY DEVICES

This application is a continuation of application Ser. No. 09/058,255 filed on Apr. 10, 1998, now U.S. Pat. No. 6,026,042, the disclosure of which is hereby incorporated by reference.

BACKGROUND OF THE INVENTION

1. Field of the Invention

The present invention relates to semiconductor memory devices and, more specifically, to sense amplifier circuits for dynamic random access memory devices (DRAMs).

2. Discussion of Related Art

Memory devices such as dynamic random access memories comprise an array of individual memory cells. Typically, each DRAM memory cell comprises a capacitor for holding a charge and an access transistor for accessing the capacitor charge. The charge is representative of a data bit and can be either high voltage or low voltage (representing, e.g., a logical "1" or a logical "0," respectively). Data can be stored in memory during write operations or read from memory during read operations. Refresh, read, and write operations in present-day DRAMs are typically performed for all cells in one row simultaneously. Data is read from memory by activating a row, referred to as a word line, which couples all memory cells corresponding to that row to digit or bit lines which define the columns of the array. When a particular word line is activated, sense amplifiers detect and amplify the data by measuring the potential difference corresponding to the content of the memory cell connected to the activated word line. The operation of DRAM sense amplifiers is described, for example, in U.S. Pat. Nos. 5,627,785; 5,280,205; and 5,042,011, all assigned to Micron Technology Inc. and incorporated by reference herein.

DRAM memory devices are called dynamic because data is stored only temporarily and must be continually rewritten or refreshed. Data is stored in the form of charged capacitors and is necessarily temporary because of parasitic leak currents in current integrated circuits (ICs). Because the capacitor charge decays away in a finite interval of time (in the order of milliseconds), periodic refresh operations which include a special read cycle followed by rewriting of the same data are necessary at regular intervals for the DRAM to retain its "memory." The advantageous attribute of DRAMs that offsets its transitory nature is its small size. Memory cell sizes in current DRAMs range from 450 $\mu m^2$ in the 16,384×1 bit DRAM to 160 $\mu m^2$ in the more advanced 65,536×1 bit DRAM.

Historically, DRAMs have had relatively large memory cells with large supply voltages. Over the last several decades, however, the densities of DRAMs have, on average, doubled every year and a half. As is well known in the art, semiconductor memories such as DRAMs are generally mass produced by fabricating hundreds of identical circuit patterns on a single semiconductor wafer, which is subsequently cut into hundreds of identical dies or chips. The advantages of building integrated circuits with smaller individual circuit elements so that more and more circuitry may be packed on a single chip are well-known. Electric equipment, for example, becomes less bulky, reliability is improved by reducing the number of solder plug connections, assembly and packaging costs are minimized, and circuit performance is improved, particularly at higher clock speeds.

The rapid increase in bit density is the result of intensive technical efforts by design and process engineers, but decreased size and increased densities of DRAMs also have associated problems. One problem is that the smaller size of individual cells leads to reducing the size of the individual electrical components in the cells, and consequently to smaller electrical signals. The magnitude of the storage capacitor of each cell decreases as well. Furthermore, as more and more individual storage cells are placed onto a single chip, the length of the column lines connecting the individual cells to the sense amplifiers becomes longer and the capacitance associated with the lines becomes larger. This means that the signal transferred to the column line from an individual cell will become even smaller as the capacitance of the line absorbs the charge, and further that the time for developing a useful signal level on the line will increase. The combination of small signals and longer lines with large associated capacitance results in long RC intervals of time for useful signal levels to rise on the lines. These RC intervals, which may be in the order of 7–9 nanoseconds, are actually "dead time," during which a word line signal propagates from the front edge to the back edge of the word line.

All of these factors reduce the magnitude of the data signal which exists on a digit line. This decrease, when coupled with the fact that the memory array produces noise which disturbs small signal detection, may lead to difficulty in properly sensing a bit value. One way of improving proper memory cell sensing is to reduce memory array noise.

A major factor which contributes to a deterioration in the ability to sense a bit value in present-day DRAMs is that all sense amplifiers associated with a particular word line are activated at the same time. In a 1-Megabit DRAM, for example, which is refreshed at 512 cycles per period, there are 2048 sense amplifiers which are activated at the same time during an active cycle. The voltage supply to the chip sees a very large current spike in a short time period, which generates memory array noise due to the fact that the current consumed by the sense amplifiers is increased rapidly, as shown by peak value Ia in FIG. 4(d). The rapid increase in the consumption of the current Is causes the supply voltage to drop while at the same time causing memory array noise.

In high density memory design, therefore, it is critical that the DRAM sense amplifiers reliably detect the low-level signals. As is well known, however, speed is also an important factor in semiconductor memory devices. Thus, while high quality sensing in present-day DRAMs is imperative, it must not be accompanied by a decrease in the sensing speed. The performance of DRAMs would be enhanced by reducing the access time of a DRAM, thereby speeding up its operation.

A technique for reducing memory array noise associated with the DRAM peak current produced by simultaneous activation of all sense amplifiers linked to a particular word line is described in U.S. Pat. No. 4,916,671 to Ichiguchi. That technique is based on activating the sense amplifiers associated with a particular active word line for selected columns only, thereby resulting in spreading out the peak current and reducing DRAM noise. This method, however, is based on advance knowledge of the particular column address of the memory cell within the word line which is being activated, so that the corresponding sense amplifiers may be activated at the same time. Another corresponding section of sense amplifiers is activated upon selection of the next memory cell with known column address. The requirement of advance knowledge of the column address, however, may lead to significantly delaying the operation of the DRAM, especially in the case where column addresses are selected more quickly than row addresses.

Another technique for reducing memory array noise associated with the DRAM peak current produced by simultaneous activation of all sense amplifiers linked to a particular word line is described in U.S. Pat. No. 5,343,433 to Duvvury et al. This technique relies on determining the peak current draw for a whole bank of sense amplifiers and selectively turning on particular columns based, as in the method described above, upon advance knowledge of column addresses, thereby reducing the peak current and the DRAM noise.

None of the above patents, however, solves the problem of reducing DRAM noise and consequently improving DRAM sensitivity by reducing the peak current in DRAM sense amplifiers while increasing DRAM speed of operation.

There is a need, therefore, to improve the sensing qualities of DRAMs, particularly high-speed, low power DRAMs, by reducing the peak current and associated noise produced by the simultaneous activation of numerous sense amplifiers associated with an active word line, while at the same time increasing the speed of operation of the DRAM.

SUMMARY OF THE INVENTION

The present invention alleviates to a great extent the above shortcomings in the prior art. The invention provides a unique method of and apparatus for improving the sensitivity of semiconductor memory devices, such as DRAMs, by reducing a peak current and associated noise normally produced by the simultaneous activation of numerous sense amplifiers associated with an active word line, while at the same time increasing the speed of operation of the semiconductor memory device.

An apparatus for improving the sensitivity of semiconductor memory devices in accordance with the present invention comprises a memory array including an active word line and an additional tracking dummy line for tracking the active word line (i.e., duplicating the propagation of the "activate row" signal from the front edge to the back edge of the word line) and sequentially activating blocks of bit lines of a fixed size starting at the beginning of the active word line, so that the total time for activation of all bit lines associated with the active word line is less than, or equal to, the dead time associated with activation of the entire word line.

The present invention thus provides a semiconductor memory device having improved sense amplifier sensitivity and reduced noise by reducing the rapid increase in current consumption, normally associated with simultaneous activation of all sense amplifiers associated with a word line, while at the same time increasing the speed of operation of the semiconductor memory device.

The present invention also provides a semiconductor memory device which prevents a drop in the supply voltage caused by the simultaneous activation of all sense amplifiers of a word line. The invention improves the sensitivity of a sense amplifier, while at the same time increasing the speed of operation of the semiconductor memory device.

These and other advantages and features of the invention will become apparent from the following detailed description of the invention which is provided in connection with the accompanying drawings.

BRIEF DESCRIPTION OF THE DRAWINGS

FIG. 7 is a timing chart showing the operation of the circuit disclosed in FIG. 2 to reduce the peak current and speed up the operation of the memory device.

DETAILED DESCRIPTION OF THE PREFERRED EMBODIMENTS

Figure 1:
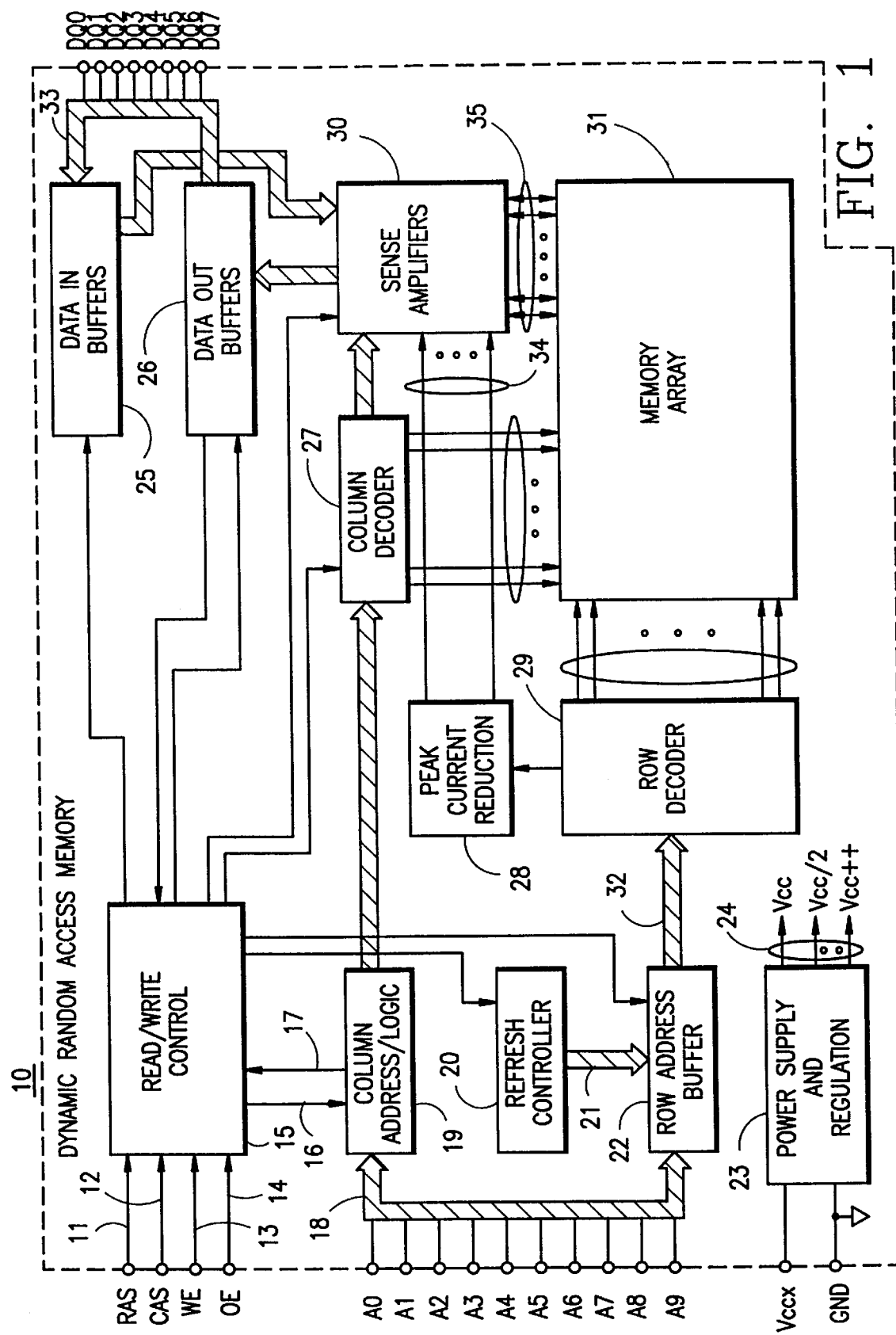
FIG. 1 is a block diagram showing a dynamic random access memory in accordance with a preferred embodiment of the present invention.

Preferred embodiments of the present invention are now described in detail in connection with the accompanying drawings. FIG. 1 illustrates a block diagram of DRAM 10, which differs from a conventional DRAM in that there is newly provided a peak current reduction block 28 which is connected to receive an "activate row" signal from row decoder 29.

DRAM 10 provides an output data signal, DQ, corresponding to data stored in the memory. DRAM 10 is controlled by binary control signals input on lines 11 through 14 from the device contacts to read/write control 15. Control signals on lines 11–14 are conventionally known by names corresponding to the primary function of each signal. The signal on line 11 is row address strobe (RAS). The signal on line 12 is column address strobe (CAS). The signal on line 13 is write enable (WE). The signal on line 14 is output enable (OE). When RAS falls, the state of address bus 18 is latched in row address buffer 22 in response to control signals from read/write control unit 15. When CAS falls, the state of address bus 18 is latched in column address logic 19 in response to control signals on line 16.

Several read and write modes of operation (also called cycles) are conducted by read/write control 15 in response to address change signals on line 17 and combinations of control signals on lines 11–14. For example, read/write control 15 responds to changes in the column address as indicated by address change signals on line 17 for improved access time as in page mode. Read/write control 15 generates control signals for two different write cycles. The first, early write, follows a RAS, WE, CAS control signal sequence. The second, late write, follows a RAS, CAS, WE control signal sequence.

When RAS falls while CAS is low, read/write control 15 provides signals to refresh controller 20 to enable self-refreshing. Refresh controller 20 includes clock circuit and means for selecting a cell to refresh. During self refresh mode, refresh controller 20 generates signals on refresh row address bus 21 (for example, as generated by the output of a refresh row address counter or register clocked by an oscillator) to select a row of cells to refresh. Row address buffer 22 provides "activate row" signals on row address bus 32 to row decoder 29. Signals on binary row address bus 32, in response to control signals, represent either the address latched when RAS falls or the refresh row address, depending on the mode of operation. During a refresh cycle, data signals on lines 35 from the selected row are amplified by sense amplifiers 30 causing the cells in the row to be refreshed.

Additionally, sense amplifiers 30 respond to control signals from read/write control 15 and column decoder signals from column decoder 27 to perform the memory read cycle. Signals RAS, CAS, WE (high), and address signals A0 through A9 cooperate to provide a control signal for a read cycle. In read operations cell content signals on lines 35 are amplified and presented to data out buffers 26 as output signals. When cell contents are to be overwritten in a write operation, sense amplifiers 30 establish proper cell contents in response to write data signals from data-in buffers 25.

Data-in buffers 25 are instrumental for write operations. Signals RAS, CAS, WE (low), OE, and address signals A0 through A9 cooperate to provide a control signal for a write cycle. In write operations cell contents are changed to correspond to the outputs of data-in buffers 25. Data-in buffers 25 are driven by data bus 33 which comprises several individual data lines shown as $DQ_n$.

DRAM 10 has eight DQ lines, each of which is bidirectional. Alternate memory devices may have less or more DQ lines and may have separate lines for the data-in (D) function and the data-out (Q) function. In memory 10, each bidirectional line is driven by a three state circuit to represent a logic low, a logic high, or an off state. In the off state, the three state circuit connects a high impedance to the DQ line so that drive circuits external to memory 10 can drive a signal onto the DQ line for data-in buffer 25.

Power supply and regulation circuit 23 responds to power supplied to memory 10 on lines $V_{ccx}$ and GND to provide power signals to all other memory functional blocks via power signal lines 24. Power signals 24 include $V_{cc}$ used generally to power functional blocks of memory 10; $V_{cc/2}$ used generally for precharging circuitry that normally attains one of two binary voltage levels symmetric in magnitude about $V_{cc/2}$; and $V_{cc+}$ used generally booted signals for writing data into memory array 31.

Peak current reduction block 28 operates to reduce the peak current produced by the simultaneous activation of numerous sense amplifiers associated with an active row by taking advantage of the dead time during which an active row (word line) signal is propagated from the front edge to the back edge of the row. Peak current reduction circuit 28 receives an "activate row" signal from row decoder 29, corresponding to the respective word line in memory array 31 to be activated. Peak current reduction block 28 tracks the row that is being activated and serially activates all columns or subdivided groups of columns in memory array 31 followed by a fixed delay after the activation of each column or group of columns. The columns of memory array 31 are activated sequentially, starting from a front column (which is the first column of memory array 31 which the propagating "activate row" signal reaches) and ending with a back column (which is the last column of memory array 31 which the propagating "activate row" signal reaches). Each column or group of columns is activated almost immediately after it is reached by the propagating "activate row" signal, with a short delay necessary to access and charge or discharge the respective memory cell connected to the column or group of column. This short delay in present-day DRAMs is approximately 1–2 nanoseconds per memory cell. The sequential activation of columns allows the current demand of column sensing to be spread out over a longer period of time, as it is occurring in parallel to the word line activation. This longer period of time, however, is not longer than the dead time during which one entire row is activated. By taking advantage of the "dead time," the access time of the DRAM 10 is reduced and its speed of operation is increased. Thus, the peak current is spread out with accompanying increase in speed of operation of DRAM 10.

Figure 2:
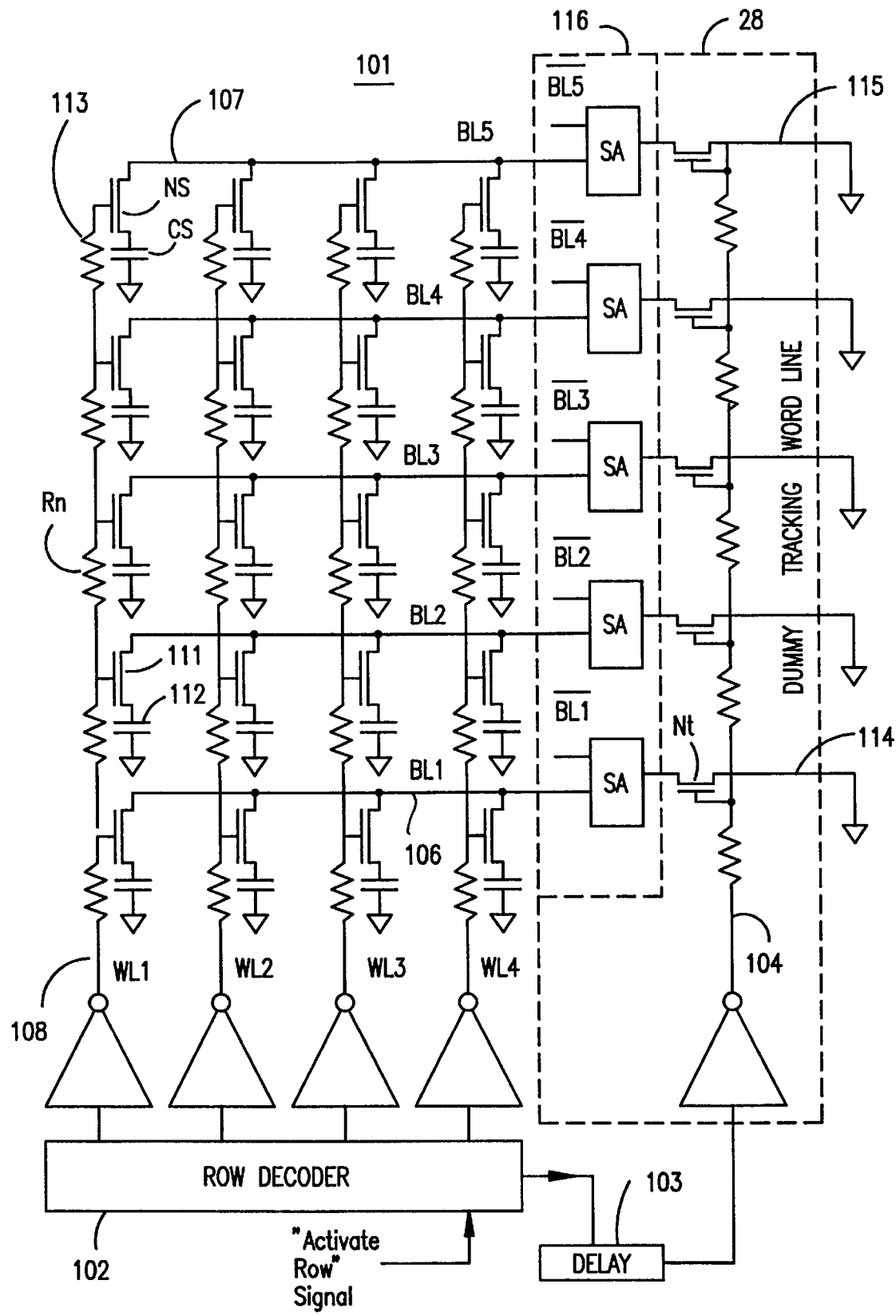
FIG. 2 is a circuit diagram showing a semiconductor memory device connected to a peak current reduction circuit according to a preferred embodiment of the present invention.

The operation of peak current reduction block 28 is further described with reference to FIG. 2, which shows in more detail part of the circuitry of FIG. 1. FIG. 2 shows DRAM 101 with a memory array of 5 rows and 4 pairs of columns (the second pair is not shown) of memory cells (comprised of capacitors Cs and transistors Ns). It should be noted, however, that the present invention is applicable to semiconductor memory arrays having any known memory cell structure, of any dimensions and density. Because the rows of the memory array are highly resistive (shown as resistors Rn) and capacitative, the a signal passing through the rows of the array is opposed by the capacitance and inductance of circuitry. Thus, it would take this signal a measurable amount of time (RC) to propagate along the row.

Additionally shown in FIG. 2 is row decoder 102, sense amplifier block 116 comprising sense amplifiers 110, fixed delay block 103, and peak current reduction block 28. Peak current reduction block 28 may be implemented using a dummy tracking word line 104. Dummy tracking line 104 follows the propagation of the "activate row" signal from front edge 108 to back edge 113 of the word line and comprises a predetermined number of taps Nt. Each tap Nt comprises, for example, an access transistor controlling sense amplifiers 110 in sense amplifier block 116. The predetermined number of taps in this embodiment is 5, one for every column pair in the array.

Figure 3:
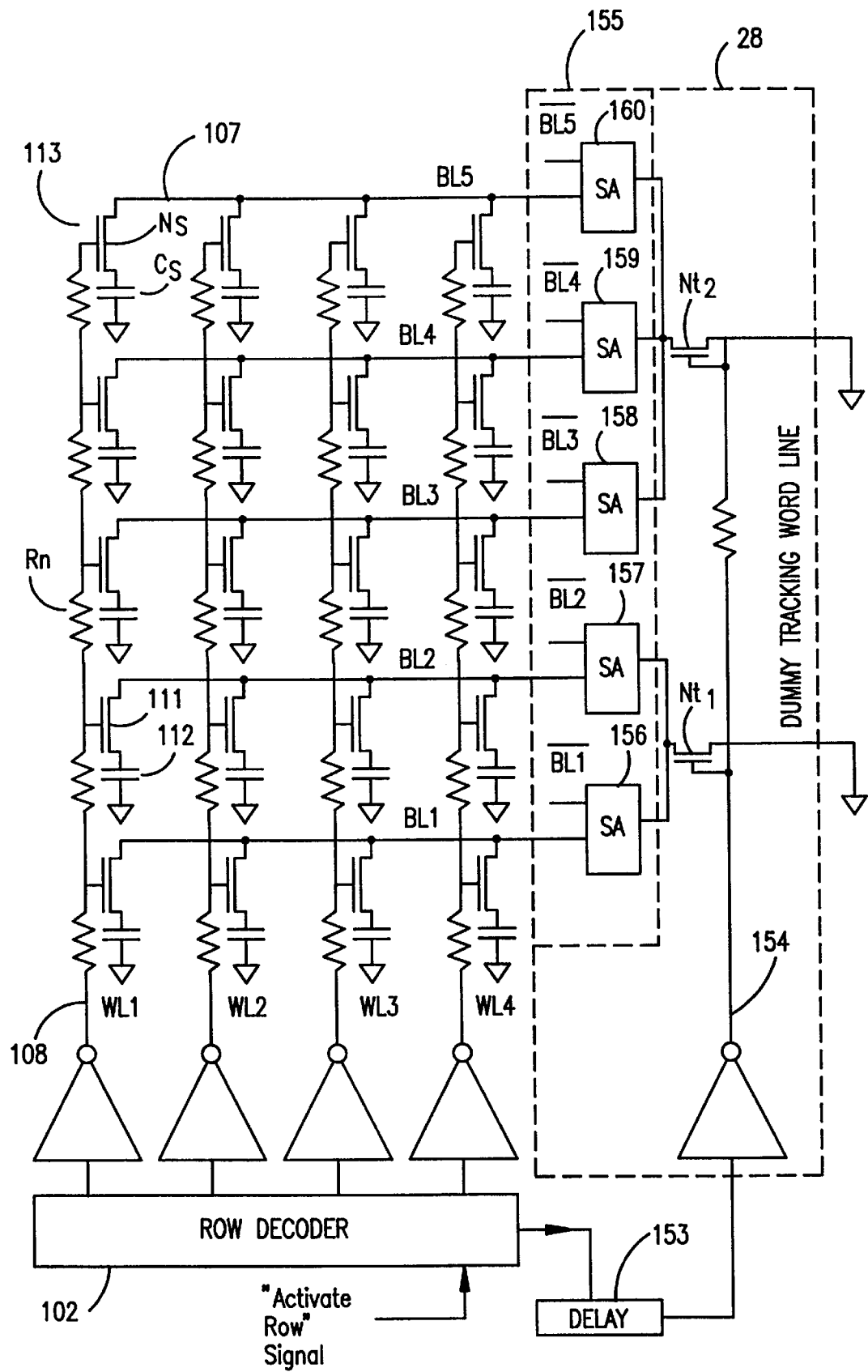
FIG. 3 is a circuit diagram showing a semiconductor memory device connected to a peak current reduction circuit according to a second preferred embodiment of the present invention.
Figure 4A:
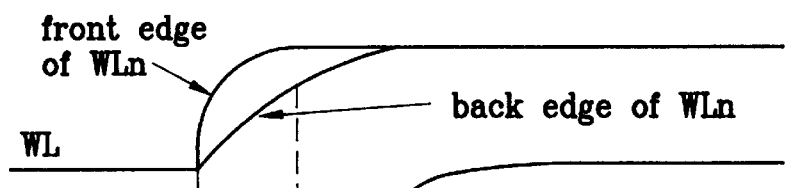
FIG. 4 is a timing chart describing the operation of a conventional/prior art DRAM.
Figure 4B:
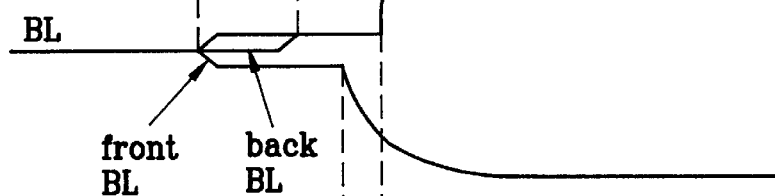
Figure 4C:
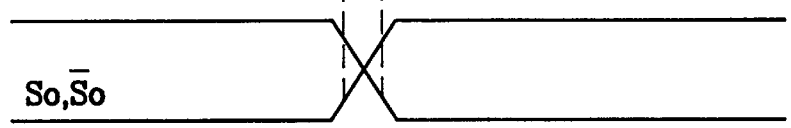
Figure 4D:
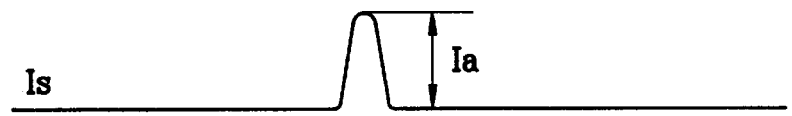
Figure 5A:
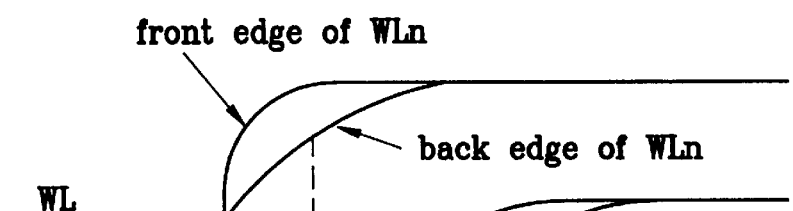
FIG. 5 is a timing chart showing the operation of the circuits shown in FIG. 2.
Figure 5B:
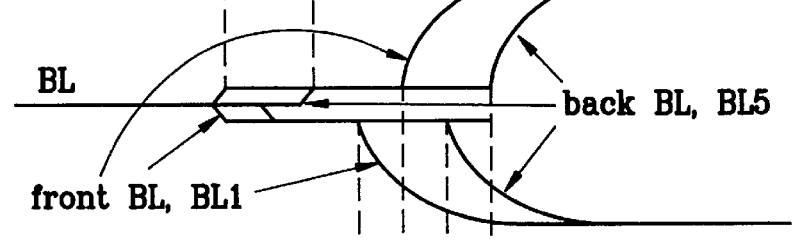
Figure 5C:
Figure 5D:
Figure 5E:

FIG. 3 shows DRAM 151 comprised of memory array of 5 rows and 4 pairs of columns, sense amplifier block 155, peak current reduction block 28, fixed delay block 153, and row decoder 102. The embodiment shown in FIG. 3 differs from the embodiment in FIG. 2 in that dummy tracking word line 154 comprises two taps Nt1 and Nt2, each controlling a block of columns of the memory array associated with a predetermined number sense amplifiers. Tap Nt1 controls a block of columns of the array associated with sense amplifiers 156 and 157. Tap Nt2 controls a block of columns of the array associated with sense amplifiers 158, 159, and 160. It should be noted that FIG. 3 depicts the present invention in its simplest form, with only two taps controlling all columns and sense amplifiers in the memory array. In this case, peak current Ia shown in FIG. 4(d) will be reduced approximately by one half, if each tap controls approximately half of the columns and associated sense amplifiers in the memory array.

Conversely, the FIG. 2 shows the most complicated embodiment of the present invention, with one tap controlling the activation of every column and associated sense amplifier in the memory array. It should be noted that the number of taps (and the number of sense amplifiers controlled by each tap) may vary from two to a maximum number equal to the number of column pairs in the array.

The operation of the device shown in FIG. 2 is as follows. The row address buffer 22 (FIG. 1) sends a "activate row" signal to row decoder 102. Row decoder 102 in turn activates the particular word line addressed (for example word line WL3) and dummy tracking line 104, after delay block 103 introduces a fixed delay. If the dead time, i.e. the time necessary for activation of the entire word line WL3 is 7–9 nanoseconds, the columns of the array are activated by dummy tracking line 104 which sequentially latches taps Nt with a 1 or 2 nanosecond delay between each sequential activation. Thus, if "activate row" signal controls activation of WL3, the first column to be activated is "front" bit line 106 (the one closest to row decoder 102, in this case BL1) after a 1 or 2 nanosecond delay, and the last is "back" bit line 107 (the one furthest from row decoder 102, in this case BL5), after a 7–9 nanosecond delay. The peak sense amplifier current for column activation is therefore spread out over 7–9 nanoseconds and its maximum value is reduced (in this case, by approximately a factor of 5). The average power consumption over the die, however, remains the same because the number of sense amplifiers that are to be activated does not change; what changes is that the sense amplifiers and associated columns are activated sequentially, over a longer period of time. The maximum period of time for activation of all columns of the array, however, does not exceed the dead time necessary for the "activate row" signal to propagate from the front edge 108 (the one closest to row decoder 102) of any given word line in the array, to the back edge 113 (the one furthest from row decoder 102) of that word line which, in this case, is approximately 7–9 nanoseconds.

FIGS. 4 and 5 show timing diagrams illustrating the peak current in the conventional operation of a DRAM (FIG. 4) and the reduction of the peak current achieved by the apparatus and method of the present invention (FIG. 5). FIG. 4(a) illustrates the rise of a word line drive signal in response to an "activate row" signal. It should be noted that the word lines are both highly resistive and capacitative; the rise time of the word line, therefore, is dependent on its electrical characteristics. Additionally, the speed of rising is different for the front and back edges of the word line, as illustrated in FIG. 4(a). When the potential difference on the bit lines increases to a certain value, as shown in FIG. 4(b), sense trigger signals So and Šo controlling the latching of the sense amplifier are output, as shown in FIG. 4(c). When the sense amplifiers are activated, the minute potential differences on the bit lines are further amplified differentially, as shown in FIGS. 4(b) and 4(c). It should be noted that there is a difference in time between the rising of the potential difference to the certain value between the front bit line (the one closest to row decoder 102) and the back bit line (the one furthest from row decoder 102), as illustrated in FIG. 4(b). Because in conventional DRAM operation all sense amplifiers are driven at the same time, when the "activate row" signal is propagated from the front edge of the word line to the back edge, the charge and discharge current in the sensing operation has a peak value Ia, as illustrated in FIG. 4(d).

FIG. 5 shows a timing chart describing the operation of the circuit shown in FIG. 2. The present invention takes advantage of the dead time necessary for the "activate row" signal to propagate to the back edge of the row. Thus, sense trigger signals So and Šo for the front bit line (BL1) are activated first, after a predetermined 1–2 nanosecond delay behind the "activate row" signal, as illustrated in FIG. 5(c). After activation of BL1, the next sense amplifier, associated with BL2 is turned on. Thus all sense amplifiers are sequentially turned on, with sense trigger signals So and Šo for the back bit line (BL5) activated last, after a preset 10 nanosecond delay behind the "activate row" signal, as illustrated in FIG. 5(d). Thus, the peak current is reduced and spread out, having a maximum value of Ib, as illustrated in FIG. 5(e), which would be Ia, if Ia were reduced by approximately a factor of 5 (the number of sense amplifier driven blocks).

Figures 6, 7A, 7B, 7C:
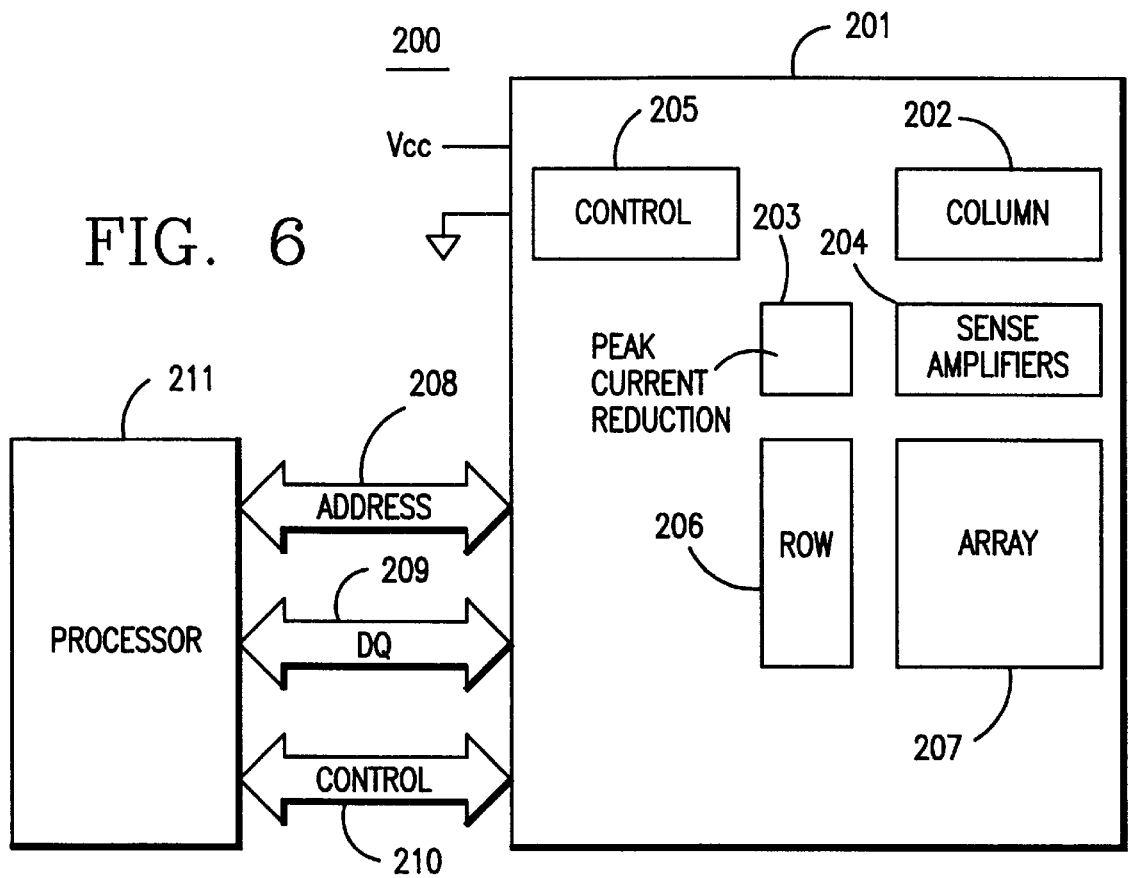
FIG. 6 is a block diagram of a personal computer incorporating the present invention.

FIG. 6 shows the improved memory design of the present invention used in a computer system 200. Computer processor 211 communicates address, data, and control information via address lines 208, data lines 209, and control lines 210, with DRAM 201. DRAM 201 operates in a similar manner to DRAM 10 shown in FIG. 1.

Referring now to FIG. 7, therein shown is a timing diagram illustrating the operation of the circuit disclosed in FIG. 2 to reduce the peak current and speed up the operation of the memory device. FIG. 7(a) shows the operation of a conventional circuit with peak current Ia occurring when all sense amplifiers are activated at the same time. FIG. 7(b) shows a the result of a different technique reducing the sense amplifier peak current. Sense amplifiers in this technique, however, are still all activated at the same time, but the current peak is reduced over time. FIG. 7(c) shows reduction of the peak current and speeding up of the operation of the DRAM according to the present invention. Activation of the sense amplifiers begins earlier, at the front edge of the activated row, rather than waiting for the signal to propagate to the back edge.

The above description is intended to be illustrative, not restrictive. Many modifications will be apparent to those skilled in the art upon reviewing the above description. Accordingly, the invention is not limited by the foregoing description, but is only limited by the scope of the appended claims.

What is claimed is new and desired to be secured by Letters Patent of the United States is:

1. A method of operating a memory circuit comprising the steps of:
   activating a word line of the memory circuit by propagating a first signal along the word line, the first signal having a propagation time period associated with propagating the word line; and
   sequentially activating a plurality of sense amplifiers connected to digit lines of the memory circuit within the propagation time period of the first signal.

2. The method of claim 1, wherein the sense amplifiers are sequentially activated in a direction from a first sense amplifier located closest to a front edge of the activated word line to a last sense amplifier located closest to a back edge of the activated word line.

3. The method of clam 1 further comprising the step of grouping the digit lines into blocks of digit lines, wherein each block comprises at least two digit lines.

4. The method of claim 3 further comprising the step of connecting each sense amplifier to a block of digit lines.

5. The method of claim 1 further comprising the step of propagating a second signal along a dummy word line coupled to the memory circuit, the second signal tracking the propagation of the first signal, and wherein the sequential activation of the plurality of sense amplifiers is performed in accordance with the propagation of the second signal.

6. The method of claim 5, wherein a duration of said second signal is not longer than the propagation time period of the first signal.

7. A method of operating a memory circuit comprising the step of:
   sequentially activating a plurality of sense amplifiers connected to a plurality of digit lines of the memory circuit, wherein the sense amplifiers are activated within a time period defined by a propagation time of an activation signal propagating along an activated word line of the memory circuit.

8. The method of claim 7, wherein the sense amplifiers are sequentially activated in a direction from a first sense amplifier located closest to a front edge of the activated word line to a last sense amplifier located closest to a back edge of the activated word line.

9. The method of claim 7 further comprising the step of grouping the digit lines into blocks of digit lines, wherein each block comprises at least two digit lines.

10. The method of claim 9 further comprising the step of connecting each sense amplifier to a block of digit lines.

11. The method of claim 7, wherein said sequentially activating step comprises:

generating a tracking signal propagating along a dummy word line coupled to the memory circuit, the tracking signal corresponding to and tracking the propagation of the activation signal; and activating the sense amplifiers in accordance with the propagation of the tracking signal.

12. The method of claim 11, wherein a duration of the tracking signal is not longer than the propagation time of the activation signal.

13. The method of claim 12, wherein a predetermined delay is introduced between the generation of the activation signal and the generation of the tracking signal.

14. A method of operating a memory circuit comprising the steps of:

propagating an activation signal along a word line of the memory circuit to activate the word line, the activation signal having a propagation time period associated with propagating the word line; and sequentially activating a plurality of sense amplifiers connected to digit lines of the memory circuit prior to an expiration of the propagation time period of the activation signal.

15. The method of claim 14, wherein the sense amplifiers are sequentially activated in a direction from a first sense amplifier located closest to a front edge of the activated word line to a last sense amplifier located closest to a back edge of the activated word line.

16. The method of claim 14 further comprising the step of grouping the digit lines into blocks of digit lines, wherein each block comprises at least two digit lines.

17. The method of claim 16 further comprising the step of connecting each sense amplifier to a block of digit lines.

18. The method of claim 14, wherein said sequentially activating step comprises:

generating a tracking signal propagating along a dummy word line coupled to the memory circuit, the tracking signal corresponding to and tracking the propagation of the activation signal; and activating the sense amplifiers in accordance with the propagation of the tracking signal.

19. The method of claim 18, wherein a duration of the tracking signal is not longer than the propagation time of the activation signal.

20. The method of claim 18, wherein a predetermined delay is introduced between the generation of the activation signal and the generation of the tracking signal.

21. A method of operating a memory circuit comprising the steps of:

providing a peak current reduction circuit coupled to a row decoder and digit lines of the memory circuit;

activating a word line coupled to the row decoder in the memory circuit by propagating an activation signal along the word line, the activation signal having a propagation time period associated with propagating the word line;

activating a dummy word line in the peak current reduction circuit by propagating a tracking signal along the dummy word line, the tracking signal corresponding to and tracking the propagation of the activation signal; and sequentially activating a plurality of sense amplifiers connected to digit lines of the memory circuit in accordance with the tracking signal, wherein a duration of the sequential activation does not exceed the activation signal propagation time period.

22. The method of claim 21, wherein the sense amplifiers are sequentially activated in a direction from a first sense amplifier located closest to a front edge of the activated word line to a last sense amplifier located closest to a back edge of the activated word line.

* * * * *